(12) United States Patent
Edelstein et al.

(10) Patent No.: US 11,804,405 B2
(45) Date of Patent: Oct. 31, 2023

(54) METHOD OF FORMING COPPER INTERCONNECT STRUCTURE WITH MANGANESE BARRIER LAYER

(71) Applicant: Tessera LLC, San Jose, CA (US)

(72) Inventors: Daniel C. Edelstein, White Plains, NY (US); Son V. Nguyen, Schenectady, NY (US); Takeshi Nogami, Schenectady, NY (US); Deepika Priyadarshini, Guilderland, NY (US); Hosadurga Shobha, Niskayuna, NY (US)

(73) Assignee: Tessera LLC, San Jose, CA (US)

( * ) Notice: Subject to any disclaimer, the term of this patent is extended or adjusted under 35 U.S.C. 154(b) by 0 days.

(21) Appl. No.: 17/556,382

(22) Filed: Dec. 20, 2021

(65) Prior Publication Data

US 2022/0115269 A1    Apr. 14, 2022

Related U.S. Application Data

(60) Continuation of application No. 17/011,823, filed on Sep. 3, 2020, now Pat. No. 11,232,983, which is a
(Continued)

(51) Int. Cl.
*H01L 21/768* (2006.01)
*H01L 21/02* (2006.01)
(Continued)

(52) U.S. Cl.
CPC .. *H01L 21/76879* (2013.01); *H01L 21/02068* (2013.01); *H01L 21/02172* (2013.01);
(Continued)

(58) Field of Classification Search
CPC ......... H01L 21/76879; H01L 21/02068; H01L 21/02172; H01L 21/02244;
(Continued)

(56) References Cited

U.S. PATENT DOCUMENTS 7,304,384 B2    12/2007   Koike et al.
7,816,256 B2    10/2010   Chen et al.
(Continued)

OTHER PUBLICATIONS

Ohoka, et al., "Integration of Self-Formed Barrier Technology for 32nm-node Cu Dual-Damascene Interconnects with Hybrid Low-k (PAr/SiOC) Strucutre," Symposium on VLSI Technology, 2006, 2 pages.
(Continued)

*Primary Examiner* — John P. Dulka
(74) *Attorney, Agent, or Firm* — Haley Guiliano LLP

(57) ABSTRACT

Low capacitance and high reliability interconnect structures and methods of manufacture are disclosed. The method includes forming a copper based interconnect structure in an opening of a dielectric material. The method further includes forming a capping layer on the copper based interconnect structure. The method further includes oxidizing the capping layer and any residual material formed on a surface of the dielectric material. The method further includes forming a barrier layer on the capping layer by outdiffusing a material from the copper based interconnect structure to a surface of the capping layer. The method further includes removing the residual material, while the barrier layer on the surface of the capping layer protects the capping layer.

20 Claims, 6 Drawing Sheets

Related U.S. Application Data continuation of application No. 16/657,169, filed on Oct. 18, 2019, now Pat. No. 10,770,347, which is a continuation of application No. 16/118,998, filed on Aug. 31, 2018, now Pat. No. 10,593,591, which is a continuation of application No. 15/825,646, filed on Nov. 29, 2017, now Pat. No. 10,325,806, which is a continuation of application No. 15/417,390, filed on Jan. 27, 2017, now Pat. No. 9,947,579, which is a continuation of application No. 14/882,568, filed on Oct. 14, 2015, now Pat. No. 9,601,371, which is a division of application No. 14/466,539, filed on Aug. 22, 2014, now Pat. No. 9,455,182.

(51) Int. Cl.
*H01L 23/528* (2006.01)
*H01L 23/532* (2006.01)
*H01L 23/522* (2006.01)

(52) U.S. Cl.
CPC .... *H01L 21/02244* (2013.01); *H01L 21/7684* (2013.01); *H01L 21/7685* (2013.01); *H01L 21/76802* (2013.01); *H01L 21/76831* (2013.01); *H01L 21/76834* (2013.01); *H01L 21/76843* (2013.01); *H01L 21/76846* (2013.01); *H01L 21/76849* (2013.01); *H01L 21/76855* (2013.01); *H01L 21/76856* (2013.01); *H01L 21/76858* (2013.01); *H01L 21/76865* (2013.01); *H01L 21/76873* (2013.01); *H01L 21/76888* (2013.01); *H01L 23/528* (2013.01); *H01L 23/5226* (2013.01); *H01L 23/53238* (2013.01); *H01L 2924/0002* (2013.01)

(58) Field of Classification Search
CPC ......... H01L 21/76802; H01L 21/76831; H01L 21/76834; H01L 21/7684; H01L 21/76843; H01L 21/76846; H01L 21/76849; H01L 21/7685; H01L 21/76855; H01L 21/76856; H01L 21/76858; H01L 21/76865; H01L 21/76873; H01L 21/76888; H01L 23/5226; H01L 23/528; H01L 23/53238; H01L 2924/0002
See application file for complete search history.

(56) References Cited

U.S. PATENT DOCUMENTS

| | | | |
|---|---|---|---|
| 7,884,475 | B2 | 2/2011 | Gambino et al. |
| 8,039,966 | B2 | 10/2011 | Yang et al. |
| 8,344,508 | B2 | 1/2013 | Hinomura |
| 8,492,274 | B2 | 7/2013 | Yang et al. |
| 9,070,689 | B2 | 6/2015 | Wang et al. |
| 9,455,182 | B2 | 9/2016 | Edelstein et al. |
| 9,601,371 | B2 | 3/2017 | Edelstein et al. |
| 9,947,579 | B2 | 4/2018 | Edelstein et al. |
| 9,947,581 | B2 | 4/2018 | Edelstein et al. |
| 10,224,241 | B2 | 3/2019 | Edelstein et al. |
| 10,262,963 | B2 | 4/2019 | Enquist |
| 10,325,806 | B2 | 6/2019 | Edelstein et al. |
| 10,593,591 | B2 | 3/2020 | Edelstein et al. |
| 2004/0263708 | A1 | 12/2004 | Cho et al. |
| 2005/0001325 | A1 | 1/2005 | Andricacos et al. |
| 2006/0273431 | A1 | 12/2006 | He et al. |
| 2007/0045851 | A1 | 3/2007 | Kitada et al. |
| 2007/0077761 | A1 | 4/2007 | Lehr et al. |
| 2009/0096102 | A1* | 4/2009 | Gambino .......... H01L 23/53238 438/643 |
| 2009/0098728 | A1 | 4/2009 | Grunow et al. |
| 2010/0155951 | A1 | 6/2010 | Koike et al. |
| 2010/0200991 | A1 | 8/2010 | Akolkar et al. |
| 2011/0057317 | A1* | 3/2011 | Koike ............... H01L 21/76877 438/653 |
| 2011/0108990 | A1 | 5/2011 | Bonilla et al. |
| 2012/0061838 | A1 | 3/2012 | Edelstein et al. |
| 2012/0273949 | A1 | 11/2012 | Liu et al. |
| 2013/0062769 | A1 | 3/2013 | Cabral, Jr. et al. |
| 2013/0075908 | A1* | 3/2013 | Cabral, Jr. ........ H01L 23/53209 438/653 |
| 2013/0187273 | A1 | 7/2013 | Zhang et al. |
| 2013/0221527 | A1 | 8/2013 | Yang et al. |
| 2013/0234284 | A1 | 9/2013 | Bonilla et al. |
| 2013/0277842 | A1 | 10/2013 | Baumann et al. |
| 2013/0285245 | A1 | 10/2013 | Cabral, Jr. et al. |
| 2013/0320556 | A1 | 12/2013 | Liu et al. |
| 2014/0030886 | A1 | 1/2014 | Fukushima et al. |
| 2014/0183743 | A1 | 7/2014 | Matsumoto et al. |
| 2014/0353828 | A1 | 12/2014 | Edelstein et al. |
| 2015/0214157 | A1 | 7/2015 | Canaperi et al. |
| 2016/0056076 | A1 | 2/2016 | Edelstein et al. |
| 2016/0329279 | A1 | 11/2016 | Edelstein et al. |
| 2017/0140981 | A1 | 5/2017 | Edelstein et al. |
| 2018/0374748 | A1 | 12/2018 | Edelstein et al. |
| 2020/0402848 | A1 | 12/2020 | Edelstein et al. |

OTHER PUBLICATIONS

List of IBM Patents or Patent Applications Treated as Related, dated Oct. 18, 2019, 1 page.
Office Action for U.S. Appl. No. 17/011,823, dated Jan. 7, 2021, Edlestein, "Interconnect Structure", 7 Pages.
Office Action for U.S. Appl. No. 17/011,823, dated Jul. 8, 2021, Edelstein, "Copper Interconnect Structure With Manganese Barrier Layer", 14 Pages.
Office action for U.S. Appl. No. 16/657,169, dated Feb. 12, 2020, Edelstein, "Interconnect Structure", 10 pages.
Au, et al., "Selective Chemical Vapor Deposition of Manganese Self-Aligned Capping Layer for Cu Interconnections in Microelectronics," Journal of the Electrochemical Society, vol. 157, No. 6, 2010, pp. D341-D345.

* cited by examiner

METHOD OF FORMING COPPER INTERCONNECT STRUCTURE WITH MANGANESE BARRIER LAYER

CROSS REFERENCE TO RELATED APPLICATIONS

This disclosure is a continuation of and claims priority to U.S. patent application Ser. No. 17/011,823, filed Sep. 3, 2020, which is a continuation of and claims priority to U.S. patent application Ser. No. 16/657,169, filed Oct. 18, 2019, now U.S. Pat. No. 10,770,347, issued Sep. 8, 2020, which is a continuation of and claims priority to U.S. patent application Ser. No. 16/118,998, filed Aug. 31, 2018, now U.S. Pat. No. 10,593,591, issued Mar. 17, 2020, which is a continuation of and claims priority to U.S. patent application Ser. No. 15/825,646, filed Nov. 29, 2017, now U.S. Pat. No. 10,325,806. issued Jun. 18, 2019, which is a continuation of and claims priority to U.S. patent application Ser. No. 15/417,390, filed Jan. 27, 2017, now U.S. Pat. No. 9,947,579. issued Apr. 17, 2018, which is a continuation of and claims priority to U.S. patent application Ser. No. 14/882,568, filed Oct. 14, 2015, now U.S. Pat. No. 9,601,371. issued Mar. 21, 2017, which is a divisional of and claims priority to U.S. patent application Ser. No. 14/466,539, filed Aug. 22, 2014, now U.S. Pat. No. 9,455,182. issued Sep. 27, 2016, which are incorporated herein by reference as if fully set forth below.

FIELD OF THE INVENTION

The invention relates to semiconductor structures and, more particularly, to low capacitance and high reliability interconnect structures and methods of manufacture.

BACKGROUND

Microelectronic devices are made of transistors and the interconnection system connecting them to make a circuit. An interconnection system may comprise lines at multiple levels connected by vias. As device dimensions shrink at both the transistor and interconnection system levels, many technical challenges arise. For example, two technical challenges of the interconnection system level include the reduction of interconnect resistive-capacitive (RC) delay and the increase in reliability (electromigration (EM) and time-dependent dielectric breakdown (TDDB)). By way of example, a circuit signal delay may be dominated by the RC delay in the interconnect system, when there are smaller distance between the lines of the interconnect system.

In order to reduce the capacitance, low dielectric (low-k) materials can be used, in addition to minimizing the dielectric constant of the cap dielectric material which has a diffusion barrier function to Cu and O diffusion, such as SiCN, SiN and SiC. However, the implementation of low-k dielectrics is limited because of the difficulty in its integration in fine dimensions. Also, the minimization of the dielectric cap material is limited because the material functions as an etching stop layer for via etching for interconnects in the upper level.

SUMMARY

In an aspect of the invention, a method comprises forming a copper based interconnect structure in an opening of a dielectric material. The method further comprises forming a capping layer on the copper based interconnect structure. The method further comprises oxidizing the capping layer and any residual material formed on a surface of the dielectric material. The method further comprises forming a barrier layer on the capping layer by outdiffusing a material from the copper based interconnect structure to a surface of the capping layer. The method further comprises removing the residual material while the barrier layer on the surface of the capping layer protects the capping layer.

In an aspect of the invention, a method comprises: forming an electroplated copper interconnect structure in an opening of a dielectric material; selectively forming a capping layer on the copper based interconnect structure which results in residual material forming on a surface of the dielectric material; oxidizing the capping layer and the residual material by exposing the capping layer and residual material to air; forming a barrier layer on the capping layer by outdiffusing Mn to a surface of the capping layer; and removing the oxidized residual material with a selective etching process.

In an aspect of the invention, an interconnect structure comprises: a copper interconnect structure formed in a dielectric material; a capping layer in contact with a top surface of the copper interconnect structure; and a barrier layer outdiffused on a surface of the capping layer.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to low capacitance and high reliability copper (Cu) interconnect structures and methods of manufacture. More specifically, the present invention provides a barrier layer, e.g., MnO or MnSiO, on the interconnect structure (e.g., capping layer) to protect the interconnect structure during removal of any residual material on dielectric material that would otherwise cause electron flow paths or line to line leakage. Advantageously, the present invention will thus reduce RC and improve reliability (e.g., electromigration (EM) and time-dependent dielectric breakdown (TDDB)) in copper nano-interconnect device structures.

Electromigration (EM) is dominated by the interface diffusion at the cap dielectric/copper interface. One of the approaches to improve the EM is to cap the top surface of the copper interconnect with metal such as Co and CoWP. However, these metal caps need to be formed selectively on top of Cu without any deposition of or contamination with the metal atoms on the dielectric surface between Cu lines. Any break in selectivity creates the TDDB problem between neighboring Cu lines such as the formation of surface defects that cause imperfect metal cap deposition selectivity. The present invention solves this problem by providing structures and respective fabrication processes to remove any residual materials formed from the deposition of metal on the dielectric material, resulting from the selective deposition process on the interconnect structure.

The copper interconnect structures of the present invention can be manufactured in a number of ways using a number of different tools. In general, though, the methodologies and tools are used to form structures with dimensions in the micrometer and nanometer scale. The methodologies, i.e., technologies, employed to manufacture the copper interconnect structures of the present invention have been adopted from integrated circuit (IC) technology. For example, the structures of the present invention are built on wafers and are realized in films of material patterned by photolithographic processes on the top of a wafer. In particular, the fabrication processes of copper interconnect structures uses three basic building blocks: (i) deposition of thin films of material on a substrate, (ii) applying a patterned mask on top of the films by photolithographic imaging, and (iii) etching the films selectively to the mask.

Figure 1:
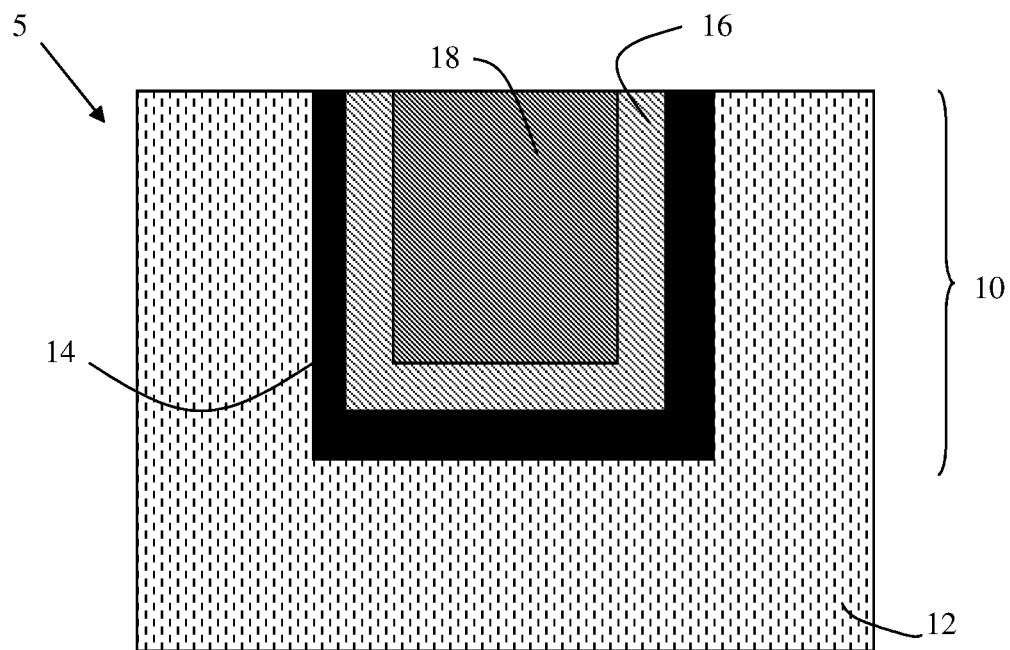
FIGS. 1-5 show fabrication processes and respective structures in accordance with aspects of the present invention.

FIG. 1 shows a structure and respective processing steps in accordance with aspects of the present invention. More specifically, the structure 5 of FIG. 1 includes an interconnect structure comprising multiple layers of material as shown by reference numeral 10. By way of exemplary formation processes, an opening is formed in a dielectric layer 12 using conventional lithography and etching processes. For example, a resist is formed over the dielectric layer 12, which is then exposed to energy (light) to form a pattern. The via is then formed in the dielectric layer 12 through the opening, using conventional reactive ion etching (RIE) processes.

After formation of the opening, an underlying barrier layer 14, for example, Tantalum Nitride (TaN) may be deposited in the via using, for example, a plasma vapor deposition (PVD) process or chemical vapor deposition (CVD) process. In embodiments, the underlying barrier layer 14 coats the sidewalls and bottom of the opening. Thereafter, a copper magnesium (CuMn) layer 16 is deposited on the underlying barrier layer 14. In embodiments, the CuMn layer 16 is deposited to a thickness of about 50 Å to 500 Å using PVD processes; although other dimensions are also contemplated by the present invention. The percent Mn of the CuMn layer is less than 20 atomic percent and preferably in the range of about 0.5% to about 20% atomic percent, depending on device application.

In embodiments and according to experimental results, below 0.5% atomic percent, e.g., 0.35% atomic percent, the Mn percentage is not enough for Mn segregation to take place. On the other hand, one upper limit can be about 10% atomic percent. This is because Mn atoms which reside in Cu even after parts of Mn atoms are consumed for the formation of Mn segregated layer will increase the Cu interconnect resistance due to the impurity scattering effect. It should be understood, though that smaller the increase of the line resistance will result with a smaller line width. Accordingly, when the line width is 7 nm, the resistance increase due to the residual Mn atoms is calculated as 10% when the Mn % is 10% atomic percent. In this way, the 10% atomic percent is set as the upper limit in practical cases; however, it is up to device application how much increase in line resistance is acceptable. From this standpoint, the range can be set at less than 20% atomic percent. In view of the above, it should be understood that the range of Mn percentage is critical, as there must be enough Mn to form the later described layers, but not too much in order to maintain a low resistance of the copper interconnect.

Still referring to FIG. 1, a copper interconnect 18 is then formed within the remaining open space of the opening. In embodiments, the copper interconnect 18 is formed by an electroplating process. In some electroplating embodiments, the CuMn layer may be used as a seed layer for the electroplating process. The entire structure 10 undergoes a low temperature annealing process to grow copper grains. In embodiments, the low temperature anneal process is at about 100° C. for about 1 hour. Any excess material on a top surface of the dielectric layer 12 is removed using, for example, a chemical mechanical process (CMP).

Figure 2:
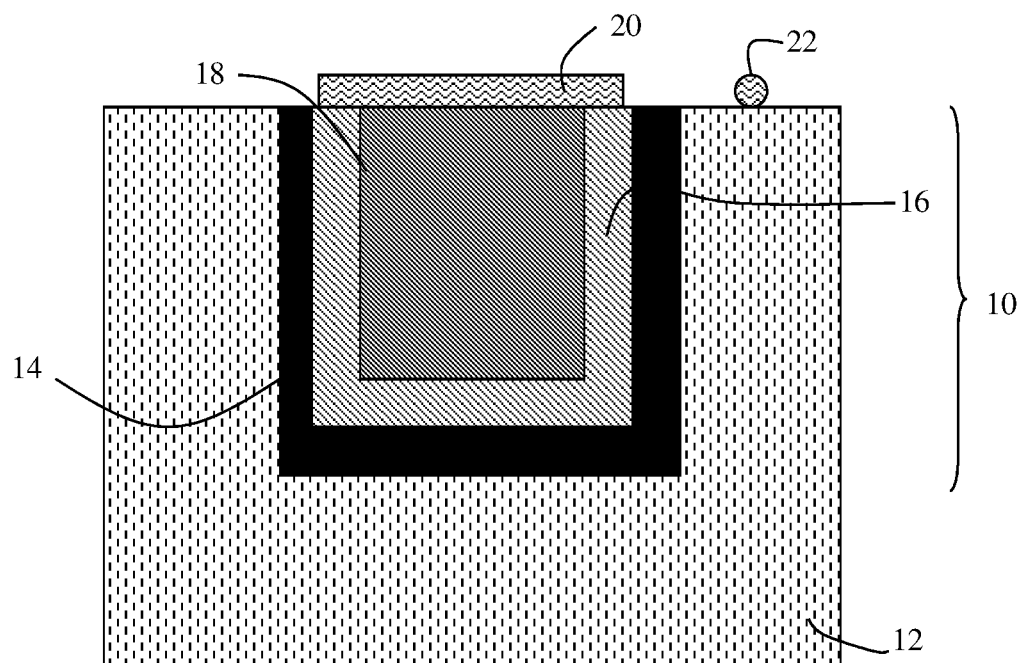

In FIG. 2, a capping layer 20 is formed on the interconnect structure 10. In embodiments, the capping layer 20 can be cobalt or CoWP deposited by a selective deposition process to the copper layer 18. In embodiments, the selective deposition process may result in residual cobalt (or CoWP) 22 being deposited on the dielectric layer 12. In alternate embodiments, the capping layer 20 can be, for example, Ru, Ag, Zn, Sn or Ni, resulting in residual material of Ru, Ag, Zn, Sn or Ni. In this alternative embodiment, the underlying barrier layer 14 may be a layer of cobalt. In any of these cases, the residual material 22 will need to be removed (as is discussed later), without removal of the capping layer 20.

Figure 3:
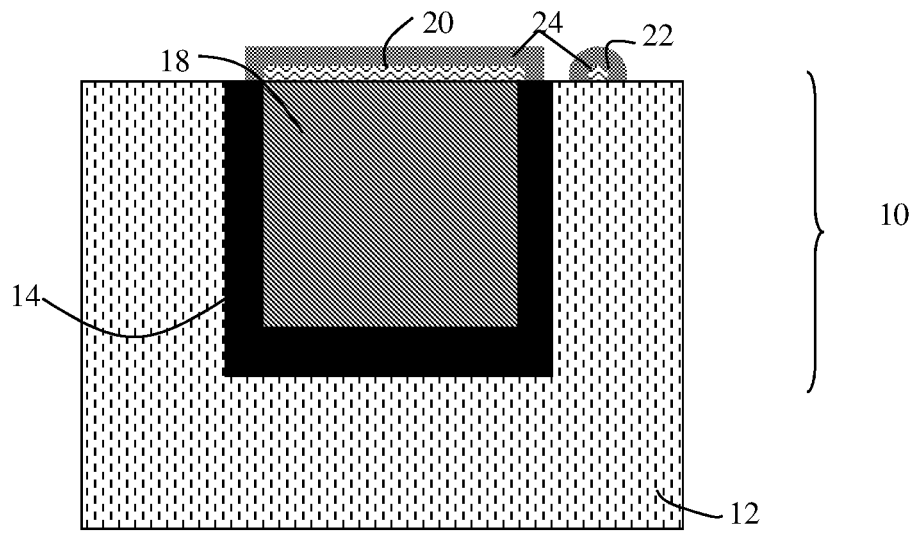

In FIG. 3, the structure of FIG. 2 and more specifically the capping layer 20 and residual material 22 undergo an oxidation process. In embodiments, the oxidation process can be performed by exposing the capping layer 20 and residual material 22 to air for about 2 hours or more. In embodiments, the oxidation process can be accelerated by an annealing process. In the case of the selective deposition of cobalt for the capping layer 20, the oxidation process will result in a CoO (cobalt oxide) passivation layer 24, coating the capping layer 20 and residual material 22. In the case of Ru, Ag, Zn, Sn or Ni as being used as the capping layer 20, the oxidation process will result in an oxidized passivation layer 24, e.g., RuO, AgO, SnO, NiO, or ZnO, coating the capping layer 20 and the residual material 22.

Figure 4:
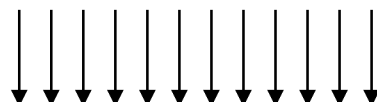
Figure 4:
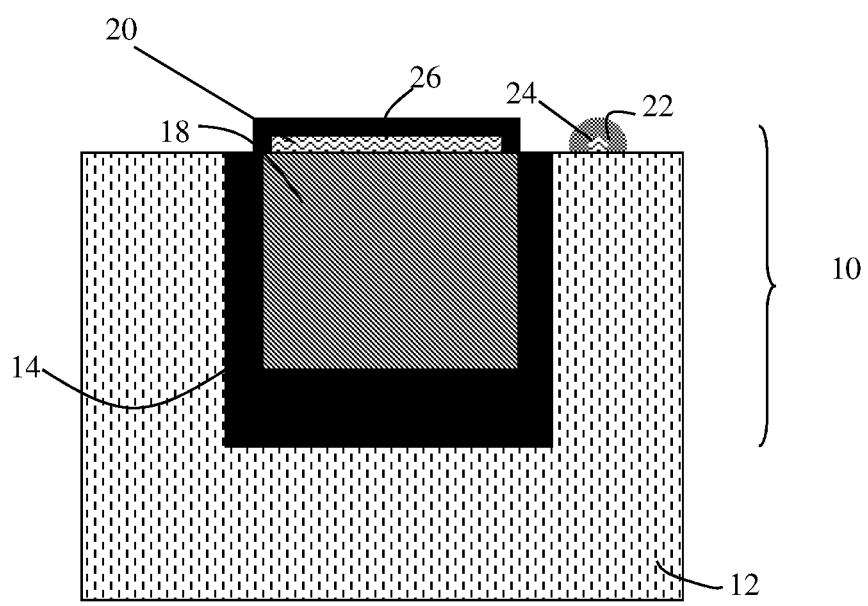

As shown in FIG. 4, the structure undergoes an annealing process to form a self aligned barrier layer 26 on top of the capping layer 20. In embodiments, the annealing process is performed at about 300° C. to about 400° C. The annealing process will result in a MnO barrier layer 26 due to outdiffusing of the Mn through the copper layer 18 and capping (Co, or CoWP or Ru, Ag, Zn, Sn or Ni) layer 20. In further embodiments, in the case in which the deposition of the dielectric material 12 is performed in an ambient containing $SiH_4$ or $Si_2H_6$ or molecules which supply Si, the barrier layer 26 can be MnSiOx; instead of a MnO. It should be understood by those of skill in the art that the annealing will not affect the oxidized passivation layer 24 on the residual material 22 regardless of the materials used for the capping layer 20. This is due to the fact that Mn will not outdiffuse through the dielectric layer 12.

Figure 5:
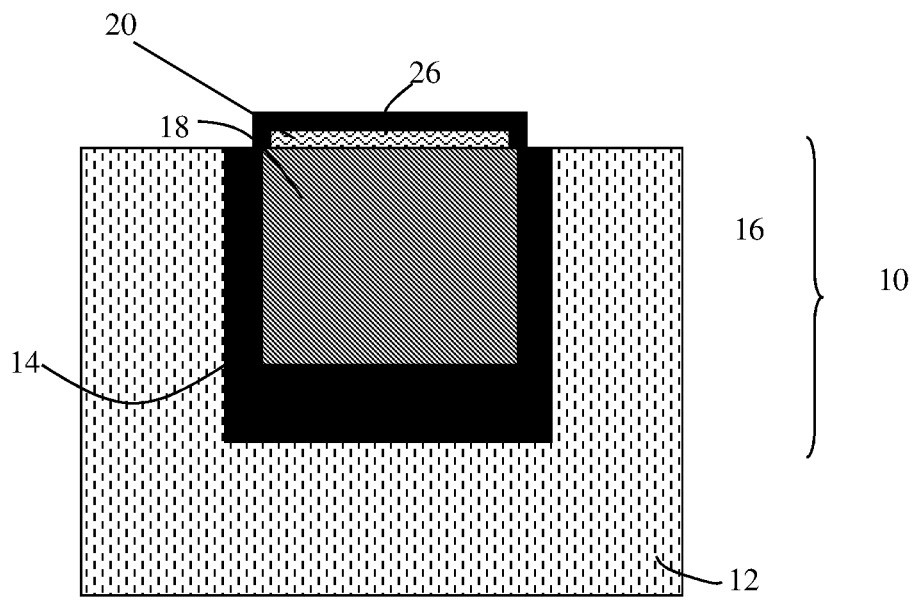

In FIG. 5, the residual material 22 and accompanying passivation layer (oxidized layer) 24 can be removed by a dry or wet etching process. In embodiments, the removal may be selective to the dielectric material 12. For example, in embodiments, dilute solution of HF can be used in the etching process to remove the residual material 22 and accompanying passivation layer 24, without removing of the dielectric layer 12 or the capping layer 20. In this way, by removing only the residual material 22, leakage issues, electron flow paths as well as TDDB issues can be eliminated.

It should be understood that the MnO (or MnSiOx) barrier layer 26 will protect the capping layer 20 during the etching process such that only the residual material 22 (between Cu lines) is removed. Also, the MnO or MnSiOx barrier layer 26 blocks the oxidation of capping layer 20 upon vacuum break, which prevents wet attack of the capping layer 20 in subsequent level post RIE via cleaning steps (which could otherwise undercut the structure by etching the capping layer 20).

FIGS. 6-9 show fabrication processes and respective structures in accordance with additional aspects of the present invention. In this embodiment, the structure 5 includes an interconnect structure 10' comprising a first layer 14' of cobalt, followed by a layer of CuMn 16 and a copper layer 18. The layers 14', 16 and 18 can be formed in the similar processes as already described herein, e.g., PVD, CVD and electroplating. A capping layer 20 is formed on the interconnect structure 10'. In embodiments, the capping layer 20 can be cobalt or CoWP, deposited by a selective deposition process as already described herein. Alternatively, the capping layer 20 can be, for example, Ru, Ag, Zn, Sn or Ni. In this alternative embodiment, the cobalt layer 14' can be replaced with a layer of Ru, Ag, Zn, Sn or Ni, respectively. In any of these embodiments, residual material 22 is formed on the dielectric material 12, as described with reference to FIG. 2.

Figure 6:
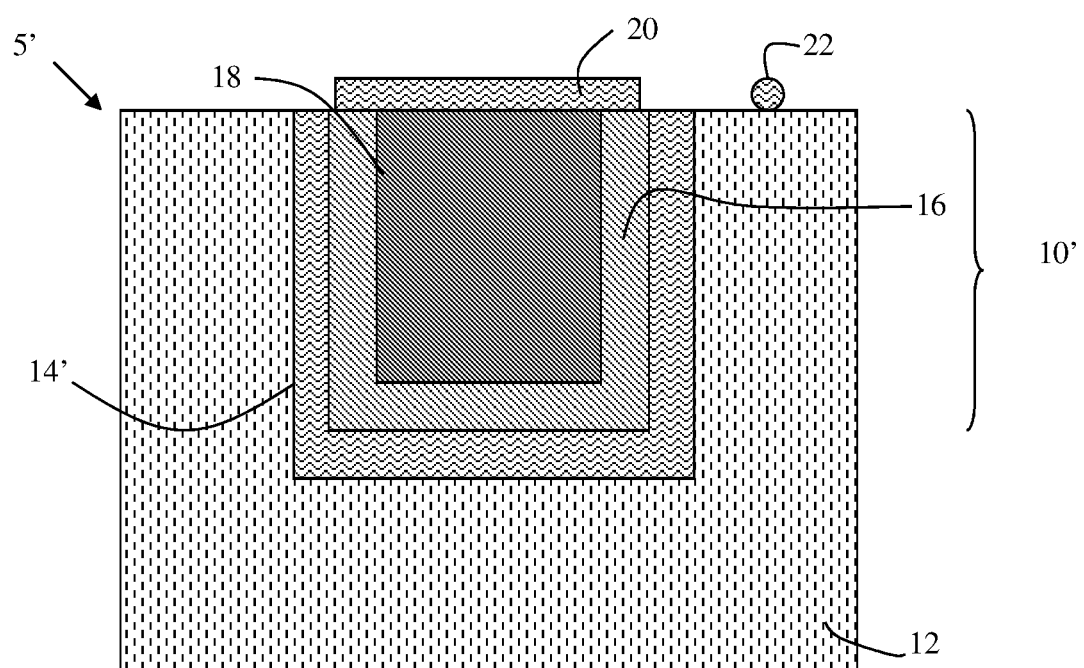
FIGS. 6-9 show fabrication processes and respective structures in accordance with additional aspects of the present invention.
Figure 7:
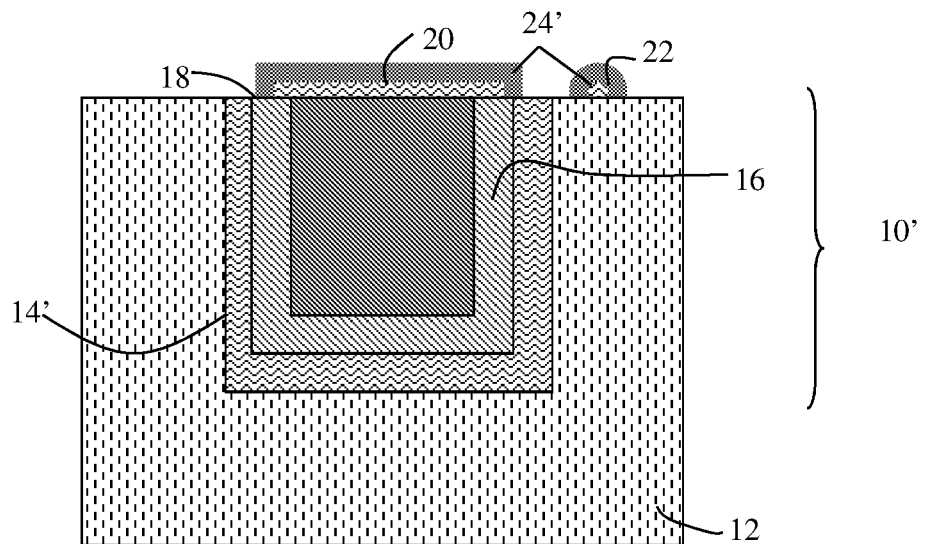

In FIG. 7, the structure of FIG. 6 and more specifically the capping layer 20 and residual material 22 undergo an oxidation process. In embodiments, the oxidation process can be performed by exposing the capping layer 20 and residual material 22 to air for about 2 hours or more. In embodiments, the oxidation process can be accelerated by an annealing process. In the case of the selective deposition of cobalt for the capping layer 20, the oxidation process will result in a CoO (cobalt oxide) passivation layer 24', coating the capping layer 20 and residual material 22. In the case of Ru, Ag, Zn, Sn or Ni as being used as the capping layer 20, the oxidation process will result in an oxidized passivation layer 24, e.g., RuO, AgO, SnO, NiO, or ZnO, coating the capping layer 20 and the residual material 22.

Figure 8:
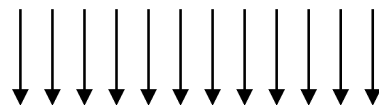
Figure 8:
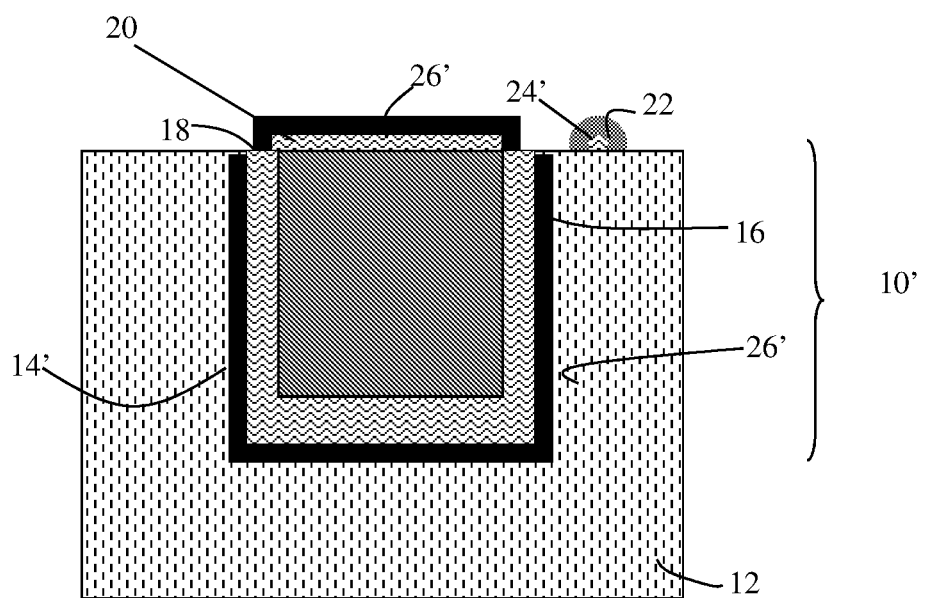

As shown in FIG. 8, the structure undergoes an annealing process to form a self-aligned barrier layer 26' on the capping layer 20 and the sidewalls of the interconnect structure 10 (e.g., lining of the via). In embodiments, the annealing process is performed at about 300° C. to about 400° C. The annealing process will result in a MnO barrier layer 26' due to outdiffusing of the Mn through the copper layer 18 and cobalt (or CoWP) layers 14' and 20. In further embodiments, in the case in which the deposition of the dielectric material 12 is performed in an ambient containing $SiH_4$ or $Si_2H_6$ or molecules which supply Si, the barrier layer 26' can then be MnSiOx; instead of a MnO. It should be understood by those of skill in the art that the annealing will not affect the oxidized passivation layer 24' on the residual material 22 regardless of the materials used for the capping layer 20. This is due to the fact that Mn will not outdiffuse through the dielectric layer 12.

Figure 9:
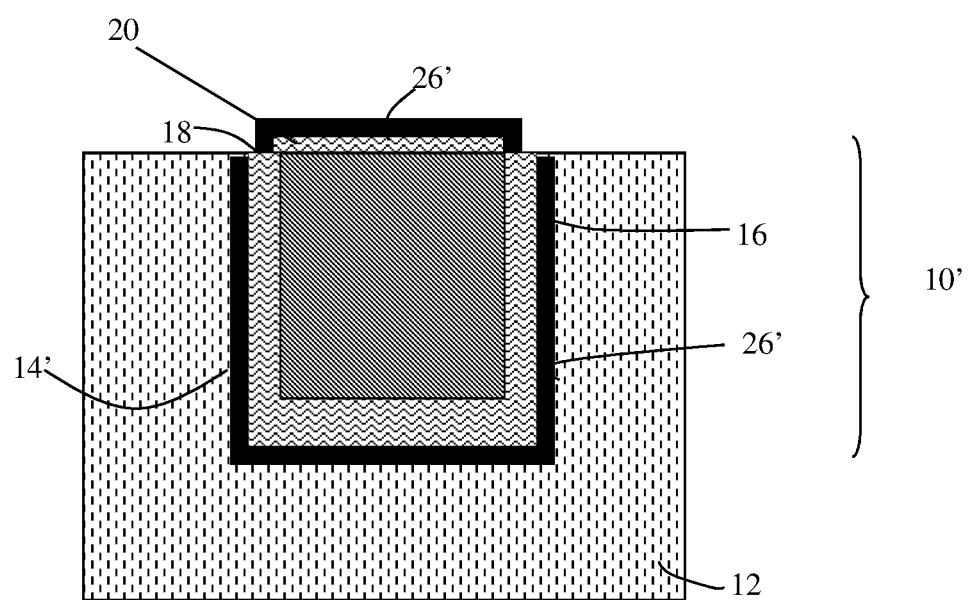

In FIG. 9, the residual material 22 and accompanying passivation layer (oxidized layer) 24 can be removed by a dry or wet etching process. For example, a dilute solution of HF can be used in the etching process to remove the residual material 22 and accompanying passivation layer 24. It should be understood that the MnO (or MnSiOx) barrier layer 26 will protect the capping layer 20 during the etching process. In this way, any leakage issues or electron flow paths can be eliminated.

By implementing the processes of the present invention, a double layered structure of MnO(Si)/Co(WP) on top of Cu lines, i.e., MnO(Si)/Co(WP)/Cu provides the Cu interconnect system with high EM reliability (Note, here, the parenthesis indicate the elements are optional). This is due to the top surface of the Cu interconnect having an interface with the metal cap of Co or CoWP. And, as should be understood, without the capping layer 20, MnO or MnSiO would be formed directly on top of copper surface which would allow void nucleation and its diffusion during current stressing more than the metal/metal interface.

Figure 10:
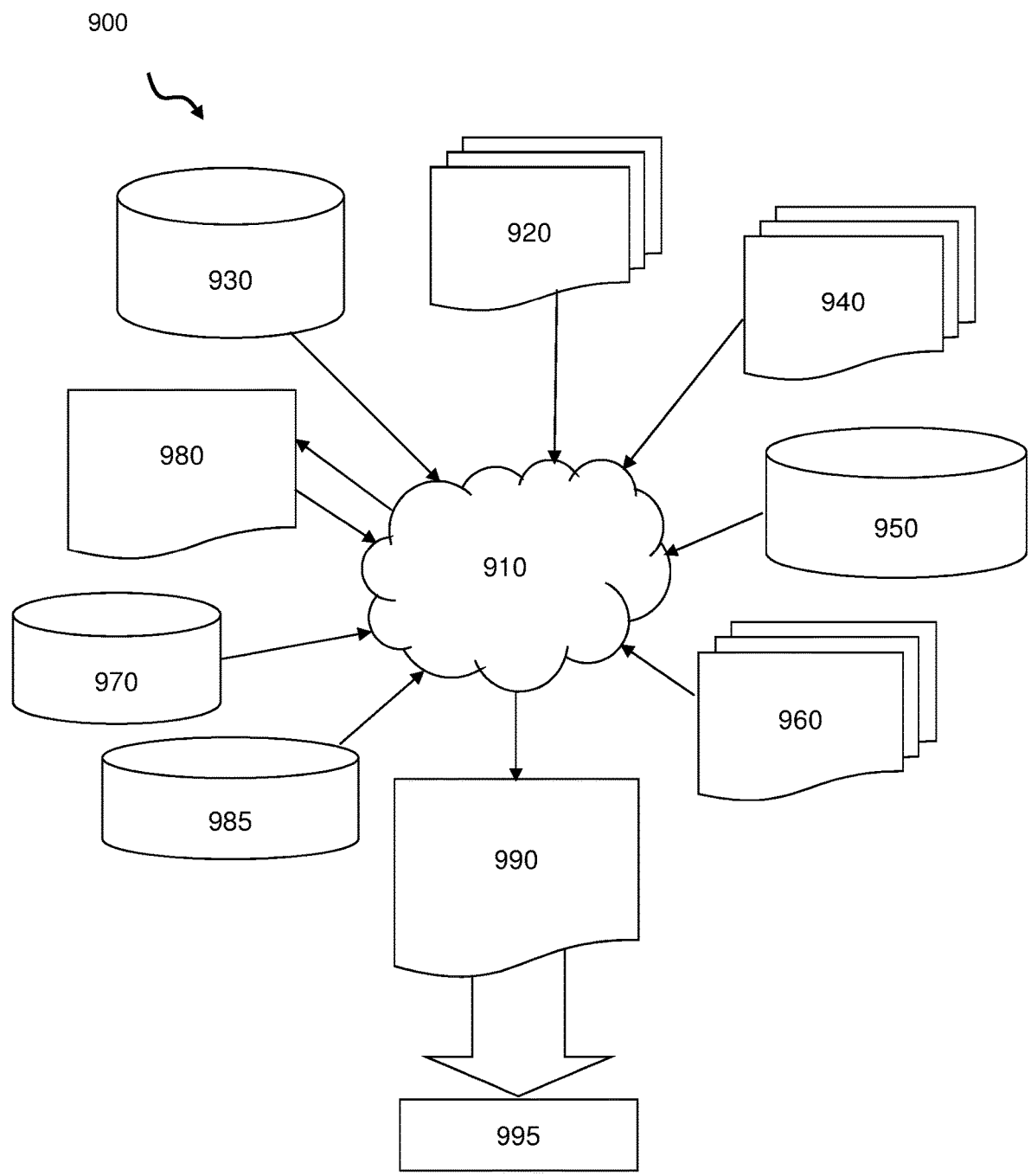
FIG. 10 is a flow diagram of a design process used in semiconductor design, manufacture, and/or test.

FIG. 10 is a flow diagram of a design process used in semiconductor design, manufacture, and/or test. FIG. 10 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-9. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-9. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-9 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-9. In one embodiment, design structure 990 may comprise a compiled, executable HDL simulation model that functionally simulates the devices shown in FIGS. 1-9.

Design structure 990 may also employ a data format used for the exchange of layout data of integrated circuits and/or symbolic data format (e.g., information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-9. Design structure 990 may then proceed to a stage 995 where, for example, design structure 990: proceeds to tape-out, is released to manufacturing, is released to a mask house, is sent to another design house, is sent back to the customer, etc.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   providing a wafer comprising a dielectric layer, wherein the dielectric layer includes an opening defined therein;
   forming an interconnect structure comprising manganese in the opening;
   forming a metallic capping layer above the opening of the dielectric layer on an upper surface of the interconnect structure; and annealing the wafer to form a first self-aligned barrier layer on an outer surface of the metallic capping layer, wherein the first self-aligned barrier layer comprises manganese and oxygen.

2. The method of claim 1, wherein the interconnect structure comprises a first layer comprising cobalt lining the opening.

3. The method of claim 1, wherein the interconnect structure comprises an underlying barrier layer comprising tantalum nitride lining the opening.

4. The method of claim 1, wherein the metallic capping layer comprises cobalt.

5. The method of claim 1, wherein the metallic capping layer comprises ruthenium.

6. The method of claim 1, wherein the metallic capping layer comprises nickel.

7. The method of claim 1, wherein:
the opening is defined in the dielectric layer by sidewalls and a bottom surface; and
and the interconnect structure comprises:
an underlying barrier layer adjacent to (i) the sidewalls and (ii) the bottom surface;
a copper-manganese layer adjacent to the underlying barrier layer; and
a copper body adjacent to the copper-manganese layer and filling a remaining portion of the opening.

8. The method of claim 1, wherein forming the metallic capping layer on the interconnect structure comprises selectively forming the metallic capping layer on the interconnect structure.

9. The method of claim 1, further comprising oxidizing the outer surface of the metallic capping layer prior to annealing.

10. A method comprising:
providing a wafer comprising a dielectric layer, wherein the dielectric layer includes an opening defined therein;
forming an interconnect structure comprising manganese in the opening;
forming a metallic capping layer on an upper surface of the interconnect structure; and
annealing the wafer to form a first self-aligned barrier layer on the metallic capping layer, wherein:
the first self-aligned barrier layer comprises manganese and oxygen;
the opening is defined in the dielectric layer by sidewalls and a bottom surface; and
the interconnect structure comprises:
a first layer adjacent to (i) the sidewalls and (ii) the bottom surface;
a copper-manganese layer adjacent to the first layer; and
a copper body adjacent to the copper-manganese layer and filling a remaining portion of the opening.

11. The method of claim 10, wherein the first layer comprises cobalt.

12. The method of claim 11, wherein a second self-aligned barrier layer is formed adjacent to (i) an outer bottom surface of the first layer and (ii) a first and a second opposing outer sidewall surface of the first layer.

13. A method of manufacturing an integrated circuit, the method comprising:
providing a wafer comprising a dielectric layer having an opening defined therein;
forming an interconnect structure comprising manganese in the opening;
forming a metallic capping layer comprising cobalt above the opening of the dielectric layer on an upper surface of the interconnect structure; and
forming a first self-aligned barrier layer on an outer surface of the metallic capping layer, wherein the first self-aligned barrier layer comprises manganese and oxygen.

14. The method of claim 13, wherein:
the opening is defined in the dielectric layer by sidewalls and a bottom surface; and
the interconnect structure comprises:
an underlying barrier layer adjacent to (i) the sidewalls and (ii) the bottom surface;
a copper-manganese layer adjacent to the underlying barrier layer; and
a copper body adjacent to the copper-manganese layer and filling a remaining portion of the opening.

15. The method of claim 14, wherein the underlying barrier layer comprises tantalum nitride.

16. The method of claim 13, wherein forming the metallic capping layer on the interconnect structure comprises selectively forming the metallic capping layer on the interconnect structure.

17. The method of claim 13, further comprising oxidizing the outer surface of the metallic capping layer prior to annealing.

18. A method of manufacturing an integrated circuit, the method comprising:
providing a wafer comprising a dielectric layer having an opening defined therein;
forming an interconnect structure comprising manganese in the opening;
forming a metallic capping layer comprising cobalt on an upper surface of the interconnect structure; and
forming a first self-aligned barrier layer on the metallic capping layer, wherein the first self-aligned barrier layer comprises manganese and oxygen, wherein:
the opening is defined in the dielectric layer by sidewalls and a bottom surface; and
the interconnect structure comprises:
an first layer adjacent to (i) the sidewalls and (ii) the bottom surface;
a copper-manganese layer adjacent to the first layer; and
a copper body adjacent to the copper-manganese layer and filling a remaining portion of the opening.

19. The method of claim 18, wherein the first layer comprises cobalt.

20. The method of claim 18, wherein a second self-aligned barrier layer is formed adjacent to (i) an outer bottom surface of the first layer and (ii) a first and a second opposing outer sidewall surface of the first layer.

* * * * *